United States Patent
Yamada et al.

(10) Patent No.: US 9,450,157 B2
(45) Date of Patent: Sep. 20, 2016

(54) ULTRAVIOLET LIGHT EMITTING DEVICE USING METAL NON-BONDABLE AMORPHOUS FLUORORESIN MOLDING COMPOUND

(71) Applicants: Soko Kagaku Co., Ltd., Aichi (JP); Asahi Glass Company, Limited, Tokyo (JP)

(72) Inventors: Kiho Yamada, Aichi (JP); Shoko Nagai, Aichi (JP); Yuta Furusawa, Aichi (JP); Akira Hirano, Aichi (JP); Masamichi Ippommatsu, Aichi (JP); Ko Aosaki, Tokyo (JP); Naoki Morishima, Tokyo (JP)

(73) Assignees: SOKO KAGAKU CO., LTD., Aichi (JP); ASAHI GLASS COMPANY, LIMITED, Tokyo (JP)

( * ) Notice: Subject to any disclaimer, the term of this patent is extended or adjusted under 35 U.S.C. 154(b) by 0 days.

(21) Appl. No.: 14/416,198

(22) PCT Filed: Apr. 17, 2014

(86) PCT No.: PCT/JP2014/060888
§ 371 (c)(1),
(2) Date: Jan. 21, 2015

(87) PCT Pub. No.: WO2014/178288
PCT Pub. Date: Nov. 6, 2014

(65) Prior Publication Data
US 2015/0243856 A1    Aug. 27, 2015

(30) Foreign Application Priority Data
Apr. 30, 2013 (JP) ................. 2013-095243

(51) Int. Cl.
*H01L 33/56* (2010.01)
*H01L 33/32* (2010.01)
*H01L 33/62* (2010.01)

(52) U.S. Cl.
CPC ............... *H01L 33/56* (2013.01); *H01L 33/32* (2013.01); *H01L 33/62* (2013.01); *H01L 2224/14* (2013.01); *H01L 2224/16225* (2013.01); *H01L 2224/8192* (2013.01)

(58) Field of Classification Search
CPC ........ H01L 33/56; H01L 33/62; H01L 33/32
See application file for complete search history.

(56) References Cited

U.S. PATENT DOCUMENTS

| 2005/0006651 A1 | 1/2005 | LeBoeuf et al. |
| 2005/0184305 A1* | 8/2005 | Ueda ....................... H01L 33/08 257/99 |
| 2006/0138443 A1 | 6/2006 | Fan et al. |
| 2007/0267645 A1 | 11/2007 | Nakata et al. |

FOREIGN PATENT DOCUMENTS

| JP | 11243227 A * | 9/1999 |
| JP | 2003-008073 A | 1/2003 |

(Continued)

*Primary Examiner* — Ermias Woldegeorgis
(74) *Attorney, Agent, or Firm* — Haynes Beffel & Wolfeld LLP

(57) ABSTRACT

An ultraviolet light emitting device having high quality and high reliability is provided by preventing deterioration of electrical characteristics which is associated with an ultraviolet light emission operation and caused by a sealing resin. The ultraviolet light emitting device is an ultraviolet light emitting device including: an ultraviolet light emitting element (2) formed of a nitride semiconductor; and an ultraviolet-transparent sealing resin (3) covering the ultraviolet light emitting element (2), wherein at least a specific portion (3a) of the sealing resin (3), which is in contact with pad electrodes (18) and (17) of the ultraviolet light emitting element (2), is a first type amorphous fluororesin, and a terminal functional group of a polymer or a copolymer that forms the first type amorphous fluororesin is a nonreactive terminal functional group which is not bondable to a metal that forms the pad electrodes (16) and (17).

9 Claims, 12 Drawing Sheets

(56) References Cited

FOREIGN PATENT DOCUMENTS

| | | |
|---|---|---|
| JP | 2006-348088 A | 12/2006 |
| JP | 2007-311707 A | 11/2007 |
| JP | 2008-308510 A | 12/2008 |
| JP | 2011-016074 A | 1/2011 |
| JP | 2011016074 A * | 1/2011 |
| JP | 2011-035236 A | 2/2011 |
| WO | 2010/074038 A1 | 7/2010 |
| WO | WO 2010074038 A1 * | 7/2010 |

* cited by examiner

| Sample | Amorphous Fluororesin | Center Emission Wavelength | Boiling Point of Solvent |
|---|---|---|---|
| #1 | No | 260nm | N.A. |
| #2 | First Type | 260nm | About 180°C |
| #3 | Second Type | 260nm | About 100°C |
| #4 | Second Type | 260nm | About 180°C |
| #5 | Second Type | 270nm | About 100°C |
| #6 | Second Type | 290nm | About 100°C |
| #7 | First Type | 269nm | About 180°C |
| #8 | Second Type | 268nm | About 100°C |

Fig. 5

ULTRAVIOLET LIGHT EMITTING DEVICE USING METAL NON-BONDABLE AMORPHOUS FLUORORESIN MOLDING COMPOUND

CROSS-REFERENCE TO RELATED APPLICATIONS

This application is a National Phase filing under 35 U.S.C. §371 of International Application No. PCT/JP2014/060888 filed on Apr. 17, 2014, and which claims priority to Japanese Patent Application No. 2013-095243 filed on Apr. 30, 2013.

TECHNICAL FIELD

The present invention relates to an ultraviolet light emitting device, and particularly to an ultraviolet light emitting device using an amorphous fluororesin as a sealing resin for sealing an ultraviolet light emitting element.

BACKGROUND ART

There have been heretofore many nitride semiconductor light emitting elements, such as LEDs (light emitting diodes) and semiconductor lasers, in which a light emitting element structure including a plurality of nitride semiconductor layers is formed on a substrate of sapphire or the like by epitaxial growth. The nitride semiconductor layer is represented by the general formula: $Al_{1-x-y}Ga_xIn_yN$ ($0 \leq x \leq 1$, $0 \leq y \leq 1$, $0 \leq x+y \leq 1$).

The light emitting structure has a double-hetero structure in which an active layer including a nitride semiconductor layer of single-quantum-well structure (SQW) or multi-quantum-well structure (MQW) is sandwiched between an n-type nitride semiconductor layer and a p-type nitride semiconductor layer. When the active layer is an AlGaN-based semiconductor layer, by adjusting an AlN molar fraction (also referred to as an Al composition ratio), band gap energy can be adjusted within a range where band gap energies that can be taken by GaN and AlN (about 3.4 eV and about 6.2 eV) are lower and upper limits, so that an ultraviolet light emitting element having a light emission wavelength of about 200 nm to about 365 nm is obtained. Specifically, when a forward-current is caused to pass from the p-type nitride semiconductor layer to the n-type nitride semiconductor layer, light emission matching the band gap occurs in the active layer.

The nitride semiconductor ultraviolet light emitting element is put to practical use after being sealed with an ultraviolet-transparent resin such as a fluorine-based resin or a silicone resin as disclosed in FIGS. 4, 8 and 7 etc. in Patent Document 1 or FIGS. 2, 4 and 6 etc. in Patent Document 2. The sealing resin protects an inside ultraviolet light emitting element from an outside atmosphere to prevent degradation of the light emitting element due to ingress of moisture, oxidation and the like. Further, the sealing resin may be provided as a refractive index difference mitigation material for improving light extraction efficiency by mitigating a reflection loss of light resulting from a refractive index difference between a light condensing lens and an ultraviolet light emitting element or a refractive index difference between a space to be irradiated with ultraviolet light and an ultraviolet light emitting element. Further, irradiation efficient can be improved by shaping the surface of the sealing resin into a light condensing curved surface such as a spherical surface.

PRIOR ART DOCUMENTS

Patent Documents

Patent Document 1: Japanese Patent Application Publication No. 2007-311707
Patent Document 2: U.S. Patent Application Publication No. 2006/0138443
Patent Document 3: Japanese Patent Application Publication No. 2006-348088

SUMMARY OF THE INVENTION

Problems to be Solved by the Invention

While use of a fluorine-based resin and a silicone resin etc. as a sealing resin for an ultraviolet light emitting element has been proposed as described above, the silicone resin is known to be progressively degraded upon exposure to a large amount of ultraviolet light. Particularly, enhancement of power of the ultraviolet light emitting element is promoted, so that, the energy density of emitted light tends to increase, and the associated increase in power consumption causes an increase in heat generation, thus raising the problem of degradation of the sealing resin by such heat generation and ultraviolet light having a high energy density.

Fluorine-based resins are known to have excellent heat resistance and high, ultraviolet light resistance, but general fluororesins such as those of polytetrafluoroethylene are opaque. The reason why such fluorine-based resins are opaque is that since the polymer chain is linear and rigid, and is easily crystallized, a crystalline portion and an amorphous portion coexist, and light is scattered at an interface therebetween.

Thus, for example, Patent Document 3 proposes that transparency to ultraviolet light is improved by using an amorphous fluororesin as a sealing resin for an ultraviolet light emitting element. Examples of amorphous fluororesins include one with a fluororesin of a crystalline polymer copolymerized and made amorphous as a polymer alloy, a copolymer of perfluorodioxole (trade name: Teflon AF (registered trademark) produced by E. I. du Pont de Nemours and Company) and a cyclopolymerization product of perfluorobutenyl vinyl ether (trade name: CYTOP (registered trademark) produced by ASAHI GLASS Co., Ltd.). The latter fluororesin of a cyclopolymerization product has a cyclic structure on the main chain, is therefore made easily amorphous, and has high transparency.

For example, as shown in JP 2011-16074, published on 27 Jan. 2011, amorphous fluororesins are broadly classified into bondable fluororesins having a functional group capable of being bonded to a metal and non-bondable fluororesins having a functional group that is hardly bonded to a metal. Thus, JP 2011-16074, published on 27 Jan. 2011 proposes that bondability between a base etc. and a fluororesin is improved by using a bondable fluororesin for a surface of the base, on which a LED chip is mounted, and a portion covering the LED chip. Similarly, some of manufacturers that provide amorphous fluororesins recommend use of a bondable fluororesin.

However, as a result of extensively conducting studies by the inventors of the present application, it has been confirmed that in the case where a bondable amorphous fluororesin is used for a portion covering a pad electrode of a nitride semiconductor ultraviolet light emitting element, electrical characteristics of the ultraviolet light emitting element are deteriorated when an ultraviolet light emission operation is performed by applying a forward voltage between metal electrode wirings connected to a p-electrode and an n-electrode, respectively, of the ultraviolet light emitting element. Specifically, it has been confirmed that a resistant leak current path is formed between the p-electrode and the n-electrode of the ultraviolet light emitting element. Here, it is considered that when the amorphous fluororesin is a bondable amorphous fluororesin having a reactive terminal functional group capable of being bonded to a metal, a reactive terminal functional group in the bondable amorphous fluororesin irradiated with high-energy ultraviolet light is separated and radicalized by a photochemical reaction, and coordinate-bonded to metal atoms which form a pad electrode, so that the metal atoms are separated from the pad electrode. Further, it is considered that an electric field is applied between pad electrodes during the light emission operation, and resultantly the metal atoms migrate to form a resistant leak current path, so that a short-circuit occurs between the p-electrode and the n-electrode of the ultraviolet light emitting element.

The present invention has been devised in view of the above-mentioned problems, and an object of the present invention is to provide an ultraviolet light emitting device having high quality and high reliability by preventing deterioration of electrical characteristics which is associated with an ultraviolet light emission operation and caused by a sealing resin.

Means for Solving the Problem

The inventors of the present application have extensively conducted studies, and resultantly found that when an amorphous fluororesin formed of a polymer or a copolymer having a nonreactive terminal functional group is used, deterioration of electrical characteristics, which is associated with an ultraviolet light emission operation and caused by a sealing resin, can be prevented, leading to the present invention shown below.

For achieving the object described above, the present invention provides an ultraviolet light emitting device comprising: an ultraviolet light emitting element formed of a nitride semiconductor; and an ultraviolet-transparent sealing resin covering the ultraviolet light emitting element, wherein as a first feature, at least a specific portion of the sealing resin, which is in contact with a pad electrode of the ultraviolet light emitting element, is a first type amorphous fluororesin, and a terminal functional group of a polymer or a copolymer that forms the first type amorphous fluororesin is a nonreactive terminal functional group which is not bondable to a metal that forms the pad electrode.

Further preferably, in the ultraviolet light emitting device according to the first feature, a structural unit that forms the polymer or the copolymer has a fluorine-containing aliphatic cyclic structure.

Further, as a second feature, the ultraviolet light emitting device according to the first feature comprises a base with metal electrode wiring formed on a part of a surface of a substrate, the ultraviolet light emitting element is placed on the base, and the pad electrode of the ultraviolet light emitting element is electrically connected to the metal electrode wiring.

Further preferably, in the ultraviolet light emitting device according to the second feature, the pad electrode and the metal electrode wiring face each other, and are electrically and physically connected to each other with a bump material interposed therebetween, and an air gap between a side of the ultraviolet light emitting element provided with the pad electrode and an upper surface of the base is filled with the first type amorphous fluororesin.

Further preferably, in the ultraviolet light emitting device according to the second feature, a portion, of the sealing resin, which is in contact with the metal electrode wiring, is the first type amorphous fluororesin.

Further preferably, in the ultraviolet light emitting devices according to the first and second, features, the center emission wavelength of the ultraviolet light emitting element is shorter than 290 nm.

Further, in the ultraviolet light emitting devices according to the first and second features, the terminal functional group is preferably a perfluoroalkyl group, and particularly the terminal functional group is preferably $CF_3$.

Further preferably, in the ultraviolet light emitting devices according to the first and second, features, a portion of the sealing resin, other than the specific portion, is the first type amorphous fluororesin, or a second type amorphous fluororesin having a terminal functional group different from that of the first type amorphous fluororesin.

Effect of the Invention

According to the nitride semiconductor device according to the above-mentioned features, the terminal functional group of the first type amorphous fluororesin to be used for the sealing resin is nonreactive, and therefore even when the resin is irradiated with high-energy ultraviolet light, a coordinate bond by a photochemical reaction is hard to occur between the terminal functional, group and metal atoms that form pad electrodes, so that a short-circuit between the pad electrodes is prevented. As a result, deterioration of electrical characteristics, which is associated with an ultraviolet light emission operation and caused by a sealing resin, is prevented, so that an ultraviolet light emitting device having high quality and high reliability can be provided.

BRIEF DESCRIPTION OF THE DRAWINGS

FIG. 5 is a table collectively showing the details of experimental samples used in a first verification experiment for verifying an effect of suppressing a light emission output defect of the ultraviolet light emitting device according to the present invention.

DESCRIPTION OF EMBODIMENT

Figure 1:
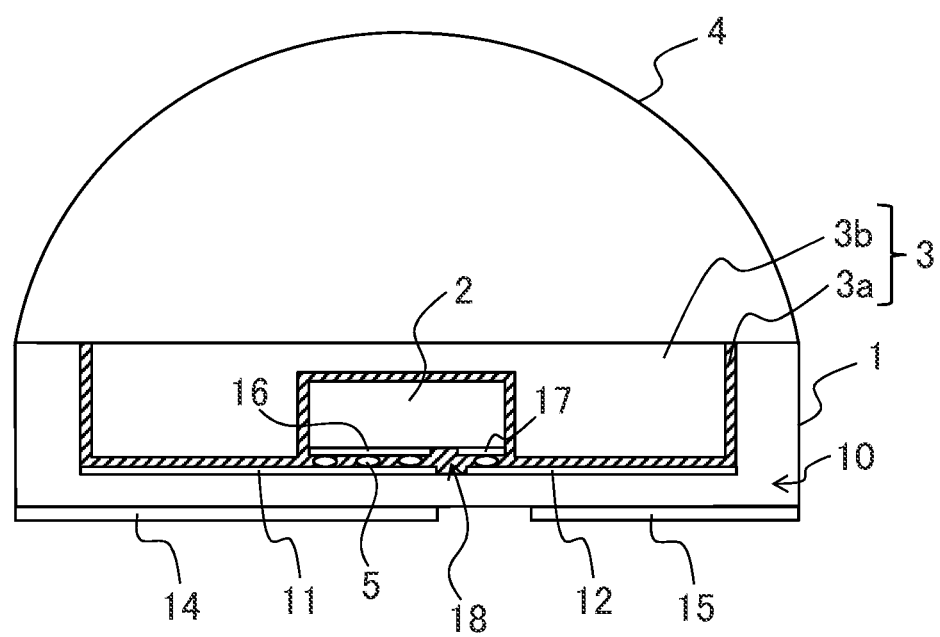
FIG. 1 is a sectional view schematically showing an outline of one example of a configuration of an ultraviolet light emitting device according to the present invention.

An embodiment of an ultraviolet light emitting device according to the present invention (hereinafter, appropriately referred to as the "the present invention device") will be described with reference to the drawings. In the drawings that are used in the following descriptions, the substance of the invention is schematically shown while the principal part is emphasized for easy understanding of the descriptions, and therefore the dimensional ratio of each part is not always identical to that of the actual device. Hereinafter, the present invention will be described based on the assumption that an ultraviolet light emitting element used, for the present invention device is an ultraviolet light emitting diode formed of a nitride semiconductor.

Figure 2A:
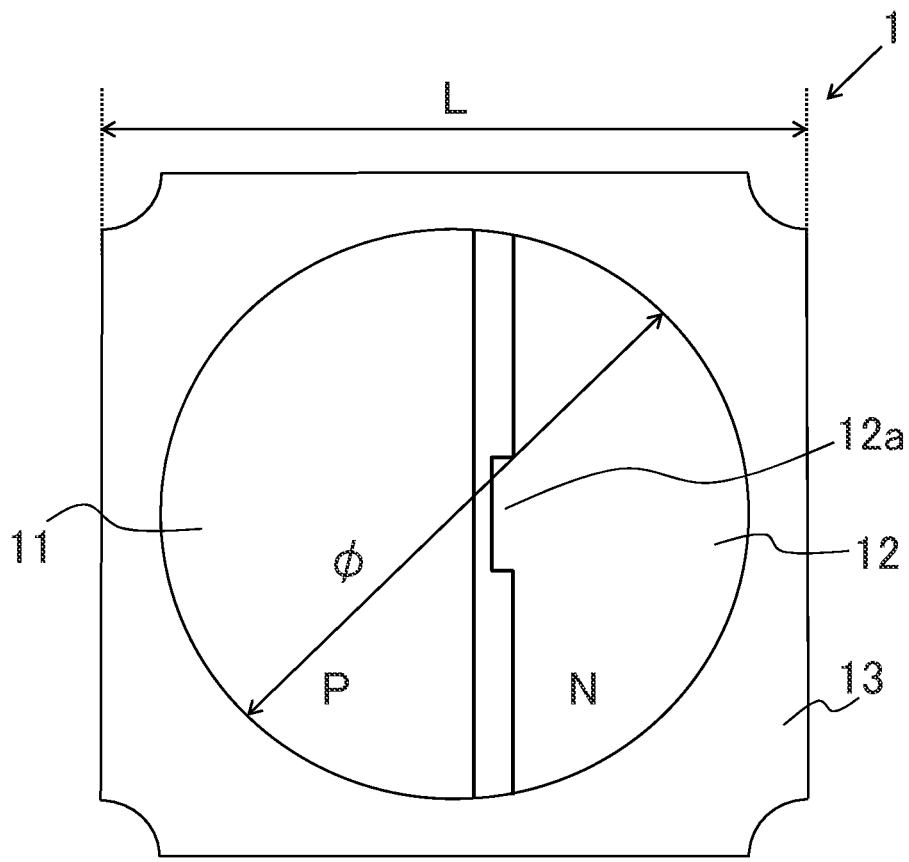
FIG. 2 is a set of plan view and sectional view showing a plane shape and a cross-sectional shape, respectively, of a sub-mount shown in FIG. 1.
Figure 2B:
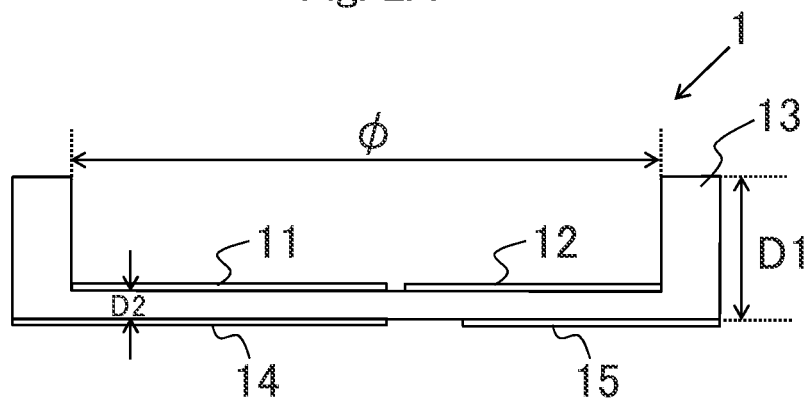

FIG. 1 is a sectional view schematically showing an outline of one example of a configuration of the present, invention device in which an ultraviolet light emitting element 2 is placed on a sub-mount 1. FIG. 2 is a plan view (A) showing a plane shape of the sub-mount 1 (corresponding to a base) and a sectional view (B) showing a cross-sectional shape of the sub-mount 1. The sub-mount 1 is configured such that first metal electrode wiring 11 on the anode side and second metal electrode wiring 12 on the cathode side are each formed on a part of a surface of a substrate 10 formed of an insulating material, a thickness D1 of a side wall portion 13 of the substrate 10 is larger than a thickness D2 of a central portion at the inside from, the side wall portion 13, and a sealing resin 3 for sealing the ultraviolet light emitting element 2 can be stored, in a space surrounded by the side wall portion 13. Further, a light condensing lens 4 formed of hemispheric quartz glass transparent to ultraviolet light emitted from the ultraviolet light emitting element 2 is fixed on the upper surface of the side wall portion 13. The sealing resin 3 is covered, with the lens 4 and thereby fixed in the space surrounded by the side wall portion 13. The first and second metal electrode wirings 11 and 12 are connected to lead terminals 14 and 15 provided on the rear surface side of the substrate 10 through a through-electrode (not illustrated) provided on the substrate 10 at the central portion. When the sub-mount 1 is placed on another printed board etc., an electrical connection is formed between metal wiring on the printed board and the lead terminals 14 and 15. The ultraviolet light transparency characteristic of the lens 4 should match the light emission wavelength of the ultraviolet light emitting element 2 that is used. The lens 4 may be not only made of quartz glass, but also formed by, for example, shaping the surface of the sealing resin 3 into a light condensing curved surface such as a spherical surface. Further, the lens 4 may be not only a light condensing lens, but also a light scattering lens depending on a use purpose, or is not necessarily required to be provided.

As shown in FIG. 2, the first and second metal electrode wirings 11 and 12 are formed so as to be exposed at the surface of the central portion of the substrate 10 surrounded by the side wall portion 13, disposed separately from each other, and electrically isolated from each other. The second metal electrode wiring 12 has a projected portion 12a protruding to the first metal electrode wiring 11 side near the center of the central portion, and the distance between the projected portion 12a and the first metal electrode wiring 11 is narrowed. The ultraviolet light emitting element 2 is placed and fixed on the first and second metal electrode wirings 11 and 12 straddling the gap of the narrowed distance between the wirings such that the surface, on which pad electrodes 16 and 17 are formed, is turned downward, and the pad electrodes 16 and 17 and the first and second metal electrode wirings 11 and 12 face each other and electrically and physically connected to each other through a metallic hump material 5. In this embodiment, the ultraviolet light emitting element 2 is mounted on the sub-mount 1 by so called flip chip mounting. A gap 18 held, between the sub-mount 1 and the ultraviolet light emitting element 2 on the periphery of the bump material 5 is also filled with the sealing resin 3.

In this embodiment, the substrate 10 of the sub-mount 1 is formed of a ceramic such as alumina ($Al_2O_3$), and the metal that forms the first and second metal, electrode wirings 11 and 12 is gold (Au).

Figure 3A:
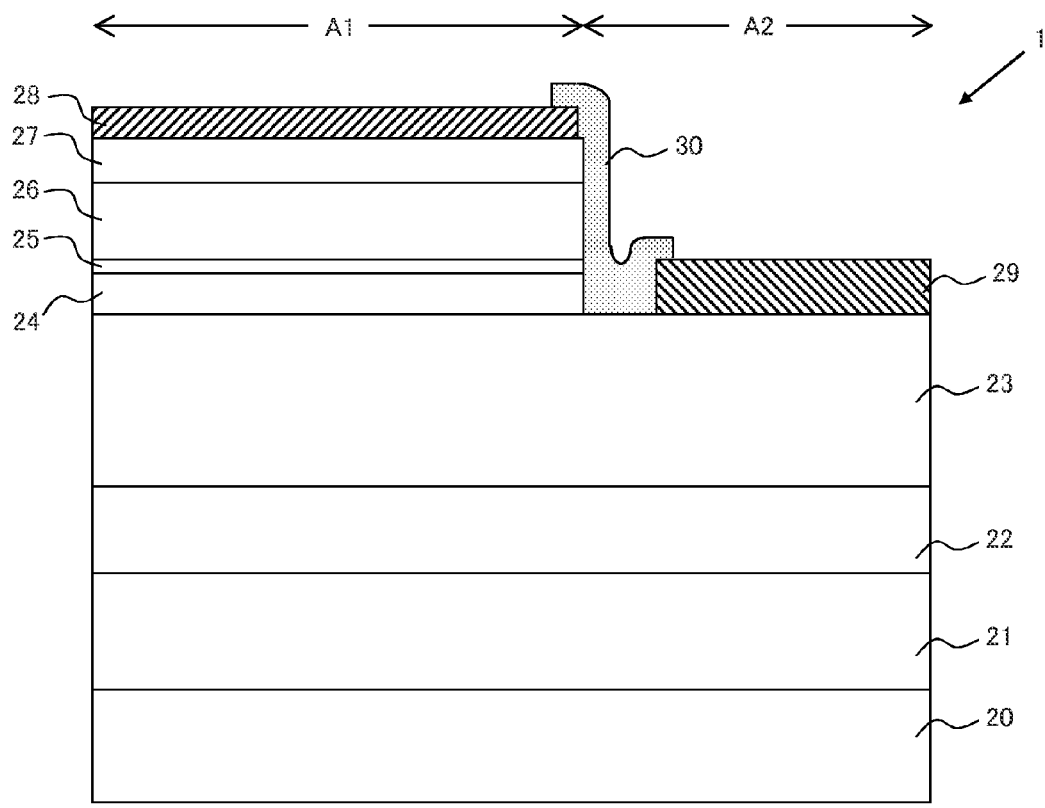
FIG. 3 is a set of sectional view and plan view schematically showing a cross-sectional structure of a principal part and a plane shape of a whole chip, respectively, of an ultraviolet light emitting element shown in FIG. 1.
Figure 3B:
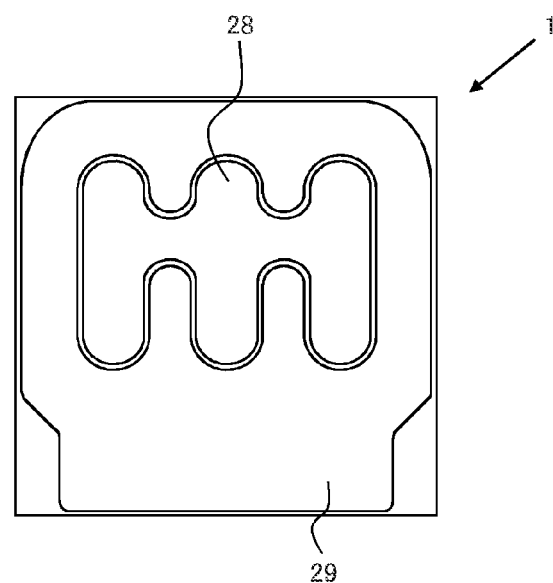

As shown in FIG. 3, the ultraviolet light emitting element 2 has a laminated structure in which a substrate with an AlN layer 21 and an AlGaN layer 22 grown on a sapphire (0001) substrate 20 is used as a template, and on the template, an n-type clad layer 23 formed of an n-type AlGaN, an active layer 24 of single or multi-layer quantum-well-structure, an electron blocking layer 25 of p-type AlGaN having an Al molar fraction higher than that of the active layer 24, a p-type clad layer 26 of p-type AlGaN and a p-type contact layer 27 of p-type GaN are laminated in order. A part of a laminated structure including the active layer 24, the electron blocking layer 25, the p-type clad layer 26 and the p-type contact layer 27 that are situated above the n-type clad layer 23 is removed by reactive ion etching etc. until the surface of the n-type clad layer 23 is partially exposed, and a laminated structure including layers of from the active layer 24 to the p-type contact layer 27 is formed on a first region (A1) on the n-type clad layer 23. The surface of the n-type clad layer 23 is exposed at a second region (A2) that is different from the first region (A1).

For example a p-electrode 28 of ITO/Ni/Au is formed on the surface of the p-type contact layer 27, and for example an n-electrode 29 of Ti/Al/Ti/Au is formed on the exposed surface of the n-type clad layer 23 within the second region (A2). In this embodiment, Au at the uppermost layer of the p-electrode 28 forms the pad electrode 16 on the anode side, and Au at the uppermost layer of the n-electrode 29 forms the pad electrode 17 on the cathode side. The exposed surface between the p-type electrode 28 and the n-electrode 29 is covered with a protective insulating film 30 of $SiO_2$ etc.

In this embodiment, the bump material 5 that connects the pad electrodes 16 and 17 and the first and second metal electrode wirings 11 and 12 is gold (Au) which is the same as the material of the pad electrodes 16 and 17 and the first and second metal electrode wirings 11 and 12.

In this embodiment, an amorphous fluororesin is used as the sealing resin 3. Particularly, as a part of the sealing resin 3 (corresponding to a specific portion) that covers a portion (hereinafter, referred to as a "metal exposed portion") at which metals of the first and second metal electrode wirings 11 and 12, the pad electrodes 16 and 17 and the bump material 5 etc. are exposed, the first type amorphous fluororesin described below is used. The first type amorphous fluororesin is an amorphous fluororesin formed of a polymer or a copolymer having a nonreactive terminal functional group that is not bondable to the above-mentioned metals. More specifically, the first type amorphous fluororesin is an amorphous fluororesin in which a structural unit that forms a polymer or a copolymer has a fluorine-containing aliphatic cyclic structure, and the terminal functional group is a perfluoroalkyl group such as $CF_3$. That is, the first type amorphous fluororesin does not have a reactive terminal functional group that is bondable to the above-mentioned metals.

Preferable as a structural unit having a fluorine-containing aliphatic cyclic structure are units based on a cyclic fluorine-containing monomer (hereinafter referred to as "unit A") or units formed by cyclopolymerization of diene fluorine-containing monomers (hereinafter referred to as "unit B").

The monomer of unit A is a monomer having a polymerizable double bond between carbon atoms constituting the fluorine-containing aliphatic ring or a monomer having a polymerizable double bond between a carbon atom, constituting the fluorine-containing aliphatic ring and a carbon atom, that is not contained in the fluorine-containing aliphatic ring. Preferable as the monomer of unit A is a compound (1) or compound (2) shown in the following formulas 1 and 2, respectively.

[Formula 1]

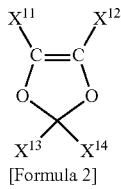

(1)

[Formula 2]

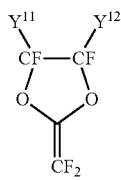

(2)

$X^{11}$, $X^{12}$, $X^{13}$ and $X^{14}$ in the formula 1, and $Y^{11}$ and $Y^{12}$ in the formula 2 are fluorine atom, perfluoroalkyl group, or perfluoroalkoxy group independently of one another. As the perfluoroalkyl group in $X^{11}$, $X^{12}$, $X^{13}$, $X^{14}$, $Y^{11}$ and $Y^{12}$, the carbon number preferably ranges from 1 to 7, and more preferably, from 1 to 4.

The perfluoroalkyl group is preferably linear or branched, and more preferably, linear. More specifically, examples thereof are a trifluoromethyl group, pentafluoroethyl group and heptafluoropropyl group, and a trifluoromethyl group is particularly preferable. As the perfluoroalkoxy group in $X^{11}$, $X^{12}$, $X^{13}$, $X^{14}$, $Y^{11}$ and $Y^{12}$, examples thereof are that an oxygen atom (—O—) is bound to the perfluoroalkoxy group.

A fluorine atom is preferable as $X^{11}$. $X^{12}$ is preferably a fluorine atom, trifluoromethyl group, or perfluoroalkoxy group with the carbon number ranging from 1 to 4, and more preferably, a fluorine atom or trifluoromethoxy group. $X^{13}$ and $X^{14}$ are preferably a fluorine atom or perfluoroalkyl group with the carbon number ranging from 1 to 4, and more preferably, a fluorine atom or trifluoromethyl group, independently of each other.

$Y^{11}$ and $Y^{12}$ are preferably a fluorine atom, perfluoroalkyl group with the carbon number ranging from 1 to 4, perfluoroalkoxy group with the carbon number ranging from 1 to 4, and more preferably, a fluorine atom or trifluoromethyl group, independently of each other.

In compound (1), $X^{13}$ and $X^{14}$ may be bound mutually to form the fluorine-containing aliphatic ring together with carbon atoms of bound $X^{13}$ and $X^{14}$. The fluorine-containing aliphatic ring is preferably a four-to-six membered ring. The fluorine-containing aliphatic ring is preferably a saturated aliphatic ring. The fluorine-containing aliphatic ring may have an ethereal oxygen atom (—O—) in the ring. In this case, the number of ethereal oxygen atoms in the fluorine-containing aliphatic ring is preferably 1 or 2. Preferable specific examples of compound (1) include compounds (1-1) to (1-5) shown in the following formulas 3-7, respectively.

[Formula 3]

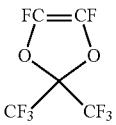

(1-1)

[Formula 4]

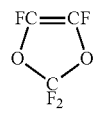

(1-2)

[Formula 5]

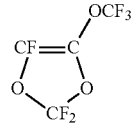

(1-3)

[Formula 6]

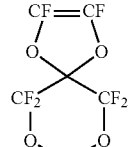

(1-4)

[Formula 7]

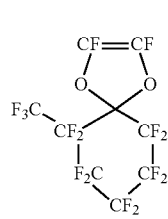

(1-5)

In compound (2), $Y^{11}$ and $Y^{12}$ may be bound mutually to form the fluorine-containing aliphatic ring together with carbon atoms of bound $Y^{11}$ and $Y^{12}$. The fluorine-containing aliphatic ring is preferably a four-to-six membered ring. The fluorine-containing aliphatic ring is preferably a saturated aliphatic ring. The fluorine-containing aliphatic ring may have an ethereal oxygen, atom (—O—) in the ring. In this case, the number of ethereal oxygen atoms in the fluorine-containing aliphatic ring is preferably 1 or 2. Preferable specific examples of compound (2) include compounds (2-1) to (2-2) shown in the following formulas 8-9, respectively.

[Formula 8]

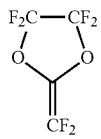
(2-1)

[Formula 9]

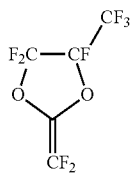
(2-2)

The first type amorphous fluororesin may be a homopolymer of the above-mentioned monomer of unit A, or a copolymer of the monomer of unit A and another monomer except such a monomer. In addition, in the copolymer, a rate of the monomer of unit A relative to the total of all the repetitive units constituting the copolymer is preferably 20 mole % or more, more preferably 40 mole % or more, and can be 100 mole %. The another monomer is not limited, particularly, as long as the monomer can be copolymerized with the monomer of unit A. More specifically, examples thereof are a diene fluorine-containing monomer described below, tetrafluoroethylene, chlorotrifluoroethylene, perfluoro (methyl vinyl ether), perfluoro (ethyl vinyl ether), and perfluoro (propyl vinyl ether).

The diene fluorine-containing monomer forming the above-mentioned unit B by cyclopolymerization is a monomer having two polymerizable double bonds and fluorine atoms. The polymerizable double bond, is not limited particularly, and is preferably a vinyl group, allyl group, acryloyl group and methacryloyl group. As the diene fluorine-containing monomer, the following compound (3) is preferable.

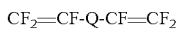
(3)

In the formula, Q may have an ethereal oxygen atom, and is a perfluoro alkylene group with the carbon number ranging from 1 to 3 such that a part of fluorine atoms can be replaced with halogen atoms except the fluorine atom. Examples of the halogen atom except the fluorine atom are a chlorine atom and bromine atom. When Q is a perfluoro alkylene group having ethereal oxygen atoms, the ethereal oxygen atoms in the perfluoro alkylene group may exist at one terminal of the group, at both terminals of the group, or between carbon atoms of the group. From the viewpoint of cyclopolymerization, the oxygen atoms preferably exist at one terminal. As a unit B formed by cyclopolymerization of compound (3), examples thereof are repetition units of units (3-1) to (3-4) shown in the following formulas 10-13.

[Formula 10]

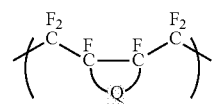
(3-1)

[Formula 11]

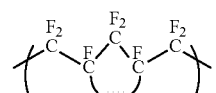
(3-2)

[Formula 12]

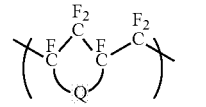
(3-3)

[Formula 13]

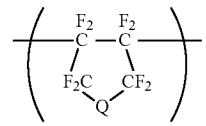
(3-4)

Specific examples of compound (3) include following compounds:

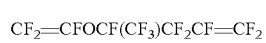

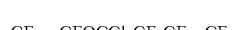

The first type amorphous fluororesin may be comprised of polymer formed by only the above-mentioned unit B, or may be a copolymer having the unit B and other monomers except the unit B. In addition, in the copolymer, a rate of the unit B relative to the total of all the repetitive units constituting the copolymer is preferably 50 mole % or more, more preferably 80 mole % or more, and most preferably 100 mole %. The other monomer is not limited particularly, as long as the monomer can be copolymerized with the diene fluorine-containing monomer. More specifically, examples thereof are cyclic fluorine-containing monomers such as compound (1) and compound (2) as described previously, tetrafluoroethylene, chlorotrifluoroethylene, perfluoro (methyl vinyl ether), perfluoro(ethyl vinyl ether), and perfluoro(propyl vinyl ether).

The average molecular weight of the first type amorphous fluororesin ranges preferably from 3,000 to 1,000,000, more preferably, from 10,000 to 300,000, and further preferably, from 100,000 to 250,000. In addition, as a cyclopolymerization method, homopolymerization method, and copolymerization method of the above-mentioned monomers, for example, it is possible to apply conventional publicly known methods disclosed in Japanese Patent Application Publication No. H04-189880, etc.

As terminal functional groups of the amorphous fluororesin after the polymerization treatment, the later-described terminal reactive functional groups and other unstable functional groups may be formed, and therefore by bringing a fluorine gas into contact with the amorphous fluororesin after the polymerization treatment using a known method disclosed in, for example, Japanese Patent Application Publication No. H11-152310 etc., these reactive terminal functional groups and unstable terminal functional groups are replaced by $CF_3$ that is a nonreactive functional group, so that the first type amorphous fluororesin to be used in the present invention device is obtained.

One example of a commercial product of the first type amorphous fluororesin is CYTOP (produced by ASAHI GLASS Co., Ltd.). CYTOP, the terminal functional group of which is $CF_3$, is a polymer of the unit B which is represented by the following chemical formula 14.

[Formula 14]

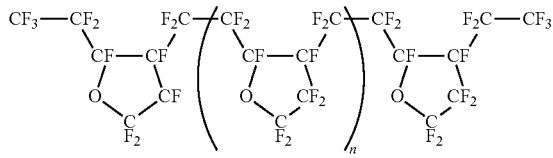

Figure 4A:
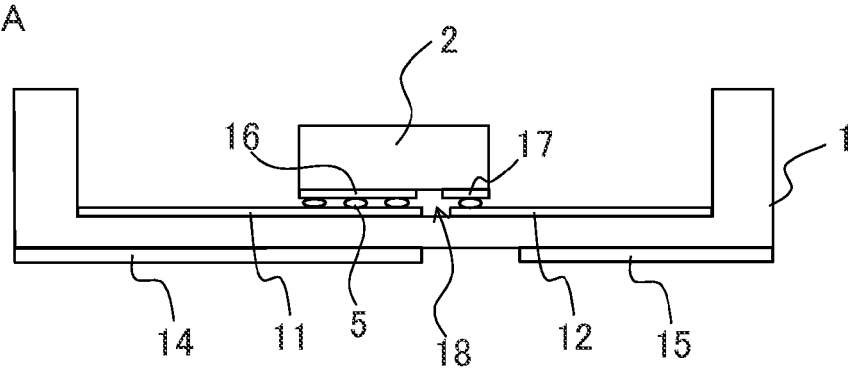
FIG. 4 is a set of process sectional views each schematically showing an outlined process of a method for producing an ultraviolet light emitting device according to the present invention.

Next, an outline of a method for preparing the present invention, device will be briefly described with reference to FIG. 4. First, as shown in FIG. 4(A), a bare chip of the diced ultraviolet light emitting element 2 is fixed on the first and second metal electrode wirings 11 and 12 of the sub-mount 1 by well known flip chip mounting using the bump material 5 (step 1). Specifically, the pad electrode 18 and the first metal electrode wiring 11 are physically and electrically connected to each other with the bump material 5 interposed therebetween, and the pad electrode 17 and the second metal electrode wiring 12 are physically and electrically connected to each other with the bump material 5 interposed therebetween. Consequently, the p-electrode 28 of the ultraviolet light emitting element 2 and the first metal electrode wiring 11 are electrically connected to each other, and the n-electrode 29 of the ultraviolet light emitting element 2 and the second metal electrode wiring 12 are electrically connected to each other.

Figure 4B:
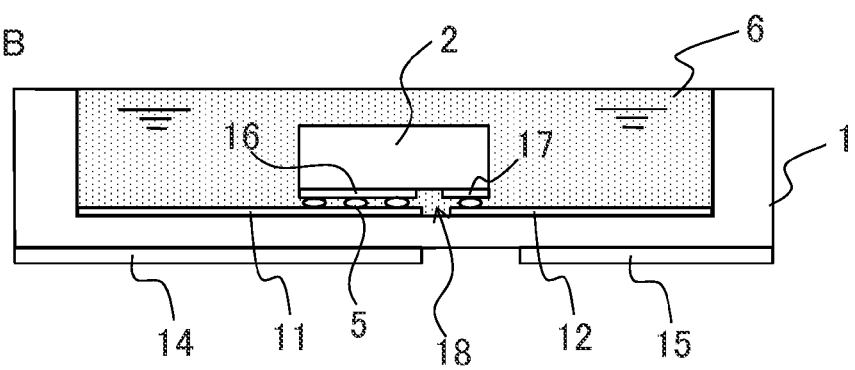
Figure 4C:
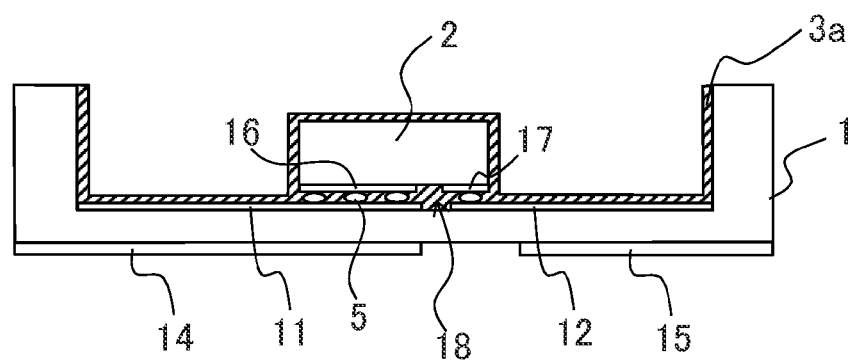

Next, as shown in FIG. 4(B), a coating solution 6 obtained by dissolving the first type amorphous fluororesin in a fluorine-containing solvent, preferably an aprotic fluorine-containing solvent is injected into a space surrounded by the side wall portion 13 of the sub-mount 1 using a Teflon needle etc. having good releasability. Thereafter, as shown in FIG. 4(C), the coating solution 6 is gradually heated to volatilize the solvent, so that a resin film 3a of the first type amorphous fluororesin is formed on the inner wall surface of the side wall portion 13 of the sub-mount 1, the upper surfaces of the first and second metal electrode wirings 11 and 12, the exposed surface of the substrate 10 between the first and second metal electrode wirings 11 and 12, and the upper surface and side surface of the ultraviolet light emitting element 2, and in the gap 18 between the lower surface side of the ultraviolet light emitting element 2 and the upper surface of the sub-mount 1 (step 2). In volatilization of the solvent in step 2, it is important to gradually heat the coating solution from a low-temperature range including and below the boiling point of the solvent (e.g. around room temperature) to a high-temperature range including and above the boiling point of the solvent (e.g. around 200° C.) to volatilize the solvent so that bubbles do not remain in the resin film 3a.

Figure 4D:
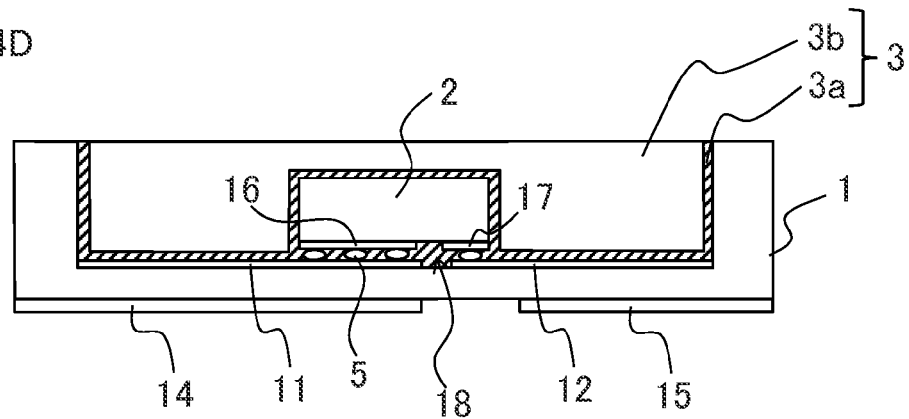

Next, as shown in FIG. 4(D), the solid first type amorphous fluororesin is put in a space inside and above the resin film 3a, which is formed in step 2, in the space surrounded by the side wall portion 13 of the sub-mount 1, and the first type amorphous fluororesin is melted at a high temperature of, for example, 250° C. to 300° C., and then gradually cooled to mold a resin film 3b (step 3).

Finally, the lens 4 is fixed to the upper surface of the side wall portion 13 (step 4), so that the present invention device shown in FIG. 1 is prepared. In the preparation method illustrated in FIG. 4, the sealing resin 3 includes the resin film 3a and the resin film 3b. The lens 4 is fixed to the upper surface of the side wall portion 13 by an adhesive as disclosed in, for example, Patent Document 1, or fixed to the upper surface of the side wall portion 13 by a fitting structure provided on the lens 4 and the side wall portion 13. The method for fixing the lens 4 is not limited to the illustrated method.

The molecular weight of the fluorine-containing solvent used in step 2 being excessively high results in not only increases in the viscosity of the coating solution 6, but also decreases in the solubility of the first type amorphous fluororesin, and therefore, the molecular weight of the fluorine-containing solvent is preferably 1000 or less. Further, to increase the solubility of the first type amorphous fluororesin, the fluorine content of the solvent is preferably in the range of 60 percent to 80 percent by weight.

Examples of the aprotic fluorine-containing solvent are polyfluoro aromatic compound, polyfluoro trialkyl amine, polyfluoro alkane, polyfluoro cyclic ether and hydro fluoro ether (HFE). These aprotic fluorine-containing solvents may be used alone, or in combination of two or more kinds.

Examples of the polyfluoro aromatic compound include perfluorobenzene, pentafluorobenzene, 1,3-bis(trifluoromethyl)benzene and 1,4-bis(trifluoromethyl)benzene. Examples of the polyfluoro trialkyl amine are perfluoro tributyl amine and perfluoro tripropyl amine. Examples of the polyfluoro cyclic ether include perfluoro(2-butyl tetrahydrofuran).

Examples of the polyfluoro alkane are perfluoro hexane, perfluoro octane, perfluoro decane, perfluoro dodecane, perfluoro(2,7-dimethyloctane), 1,1,2-trichloro-1,2,2-trifluoroethane, 1,1,1-trichloro-2,2,2-trifluoroethane, 1,3-dichloro-1,1,2,2,3-pentafluoropropane, 1,1,1,3-tetrachloro-2,2,3,3-tetrafluoropropane, 1,1,3,4-tetrachloro-1,2,2,3,4,4-hexafluorobutane, perfluoro(1,2-dimethylhexane), perfluoro (1,3-dimethylhexane), perfluoro cyclohexane, perfluoro(1,3,5-trimethylcyclohexane), 2H,3H-perfluoropentane, 1H-perfluorohexane, 1H-perfluorooctane, 1H-perfluorodecane, 1H,1H,1H,2H,2H-perfluorohexane, 1H,1H,1H,2H, 2H-perfluorooctane, 1H,1H,1H,2H,2H-perfluorodecane 3H,4H-perfluoro-2-methylpentane, 2H,3H-perfluoro-2-methylpentane, 1H-1,1-dichloro perfluoropropane and 1H-1,3-dichloro perfluoropropane.

The hydro fluoro ether (HFE) is preferably an HFE represented by general formula $R^1$—O—$R^2$ ($R^1$ is a linear or branched polyfluoro alkyl group with the carbon number ranging from 5 to 12 that may have an ether bond, and $R^2$ is a linear or branched alkyl group with the carbon number ranging from 1 to 5.) When the carbon number of $R^1$ is 4 or less, it is hard to dissolve the fluorine-containing polymer, and since the $R^1$ with the carbon number being 13 or more is hard to commercially get, the carbon number of $R^1$ is selected, from the range of 5 to 12. The carbon number of $R^1$ preferably ranges from 6 to 10, and more preferably, from 6 to 7 and from 9 to 10. The polyfluoro alkyl group is a group where two or more hydrogen atoms of the alkyl group are replaced with fluorine atoms, and includes perfluoro alkyl groups where all the hydrogen atoms of the alkyl group are replaced with fluorine atoms, and groups where two or more hydrogen atoms of the alkyl group are replaced with fluorine atoms while one or more hydrogen atoms of the alkyl group are replaced with halogen atoms except the fluorine atom. The halogen atom except the fluorine atom is preferably a chlorine atom.

The polyfluoro alkyl group is preferably a group where 60% or more of the number of hydrogen atoms of a corresponding alkyl group are replaced with fluorine atoms, and more preferably, a group where 80% or more of such a number are replaced with fluorine atoms. The polyfluoro alkyl group is further preferably a perfluoro alkyl group. In the case of $R^1$ having an ether bond, since the solubility is inhibited when the number of ether bonds is too high, the number of ether bonds in the $R^1$ preferably ranges from 1 to 3, and more preferably, 1 or 2. When the carbon number of $R^2$ is 6 or more, the solubility of the polymer containing the fluorine-containing cyclic structure is extremely inhibited. Preferable examples of $R^2$ are a methyl group or ethyl group.

Examples of the HFE are $F(CF_2)_5OCH_3$, $F(CF_2)_6OCH_3$, $F(CF_2)_7OCH_3$, $F(CF_2)_8OCH_3$, $F(CF_2)_9OCH_3$, $F(CF_2)_{10}OCH_3$, $H(CF_2)_6OCH_3$, $(CF_3)_2CF(OCH_3)CFCF_2CF_3$, $F(CF_2)_3OCF(CF_3)CF_2OCH_3$, $F(CF_2)_3OCF(CF_3)CF_2OCF(CF_3)CF_2OCH_3$, $F(CF_2)_8OCH_2CH_2CH_3$, $(CF_3)_2CFCF_2CF_2OCH_3$, and $F(CF_2)_2O(CF_2)_4OCH_2CH_3$. As the HFE, $(CF_3)_2CF(OCH_3)CFCF_2CF_3$ is particularly suitable. In addition, among the fluorine-containing solvents except the above-mentioned solvents are fluorine-containing polyethers of low molecular weights, etc.

In the above descriptions, a case where injection of the coating solution 6 and volatilization of the solvent in step 2 are each performed one time, but the resin film 3a may be formed by repeating injection of the coating solution 6 and volatilization of the solvent multiple times.

In the preparation method illustrated in FIG. 4, the resin film 3b is formed by melt molding in step 3, but the resin film 3b may be formed by repeatedly carrying out a method in which the coating solution 6 similar to that in step 2, and a solvent is volatilized.

The amorphous fluororesin used for the resin film 3b may be the first type amorphous fluororesin used for the resin film 3a, or may be a second type amorphous fluororesin formed of a polymer or copolymer having a reactive terminal functional group bondable to metals that form the first and second metal electrode wirings 11 and 12, the pad electrodes 16 and 17 and the bump material 5. As the structural unit that forms the polymer or copolymer in the second type amorphous fluororesin, one identical to the structural unit of the first type amorphous fluororesin can be used. Examples of the terminal functional group of the second type amorphous fluororesin include a COOH group, a $NH_2$ group, a COOR group, $Si(OR)_n$ group, a COF group, a $SiCl_3$ group, a $N=C=O$ group, an OH group, a $CF=CF_2$ group, an OR group and $CF_2H$ group. R represents an alkyl group.

The present invention device is characterized in that as a part of the sealing resin 3 covering the metal-exposed portion (resin film 3a in the example shown in FIG. 4), the first type amorphous fluororesin formed of a polymer or a copolymer having a nonreactive terminal functional group that is not bondable to the metals is used.

Next, experimental results of verifying an effect of using the first type amorphous fluororesin as the resin film 3a covering the metal-exposed, portion will be described.

The following eight samples #1 to #8 were provided as experimental samples. The sub-mount 1 used in each of the samples #1 to #8 was one in which the external dimension L of the side wall portion 13 shown in FIG. 2 (including notch portions at four corners) was 5 mm-square, the diameter Φ of the circular space inside the side wall portion 13 was 4 mm, the thickness D1 of the side wall portion 13 was 1 mm, and the thickness D2 of the substrate at the central portion was 0.2 mm. The die size of the ultraviolet light emitting element 2 is 0.8 mm-square. The samples #1 to #8 were each soldered onto a printed board of 15 mm square, and from an electrode terminal on the printed board, a forward voltage necessary for the light emission operation was applied between the p-electrode and the n-electrode of the ultraviolet light emitting element 2 placed on the sub-mount 1. Nine bumps were formed, for the pad electrode 16 on the p-electrode 28 side, and four bumps were formed for the pad electrode 17 on the n-electrode 29 side.

The sample #1 is a sample which is not resin-sealed yet and has a center emission wavelength of 260 nm, the sample #2 is a sample resin-sealed with the first type amorphous fluororesin and having a center emission wavelength of 260 nm, the samples #3 and #4 are samples resin-sealed with the second type amorphous fluororesin and having a center emission wavelength of 260 nm, the sample #5 is a sample resin-sealed with the second type amorphous fluororesin and having a center emission wavelength of 270 nm, the sample #6 is a sample resin-sealed with the second type amorphous fluororesin and having a center emission wavelength of 290 nm, the sample #7 is a sample resin-sealed with the first type amorphous fluororesin and having a center emission wavelength of 269 nm, and the sample #8 is a sample resin-sealed with, the second type amorphous fluororesin and having a center emission wavelength of 268 nm. The half width of the light emission wavelength distribution of each sample is about 12 nm. In the samples #2 to #8, only the resin film 3a is formed, and the resin film 3b is not formed. The lens 4 is not attached to the samples #1 to #8.

The first and second type amorphous fluororesins used in the experimental samples are each CYTOP produced by ASAHI GLASS Co., Ltd., the reactive terminal functional group of the first type amorphous fluororesin is $CF_3$, and the reactive terminal functional group of the second, type amorphous fluororesin is COOH. The sample #3 and the sample #4 are different in boiling point of the solvent used in step 2 of the preparation method in FIG. 4, with the boiling point of the solvent used in the sample #3 being about 100° C. and the boiling point of the solvent used in the sample #4 being about 180° C., so that there is a difference between samples #3 and #4 in heating temperature and heating time for volatilizing the solvent in step 2. The boiling point of the solvent used for preparation of the samples #2 and #7 is about 180° C., and the boiling point of the solvent used for preparation of the samples #5, #6 and #8 is about 100° C. FIG. 5 shows a table collectively showing the details of the experimental samples. The samples #2 and #7 are samples of the present, invention device, and other samples, i.e. the samples #1 and #3 to #8 and #8 are samples for comparison. The thickness of the resin film 3a covering the metal-exposed portion in the samples #2 to #8 is about 30 μm at a thin portion. The height of the gap 18 held between the sub-mount 1 and the ultraviolet light emitting element 2 is smaller than this thickness, and the gap 18 is filled with the first or second type amorphous fluororesin appropriate to each of the samples #2 to #8.

As a first verification experiment, the experimental samples #1 to #6 were subjected to light emission output measurement in which a time-dependent change in light emission output was detected by continuously measuring a light emission output by a photodiode disposed so as to face the ultraviolet light emitting element 2 while maintaining the light emitting operation state, and I-V characteristic measurement in which an I-V characteristic was measured at each of three time points: before resin sealing; after resin sealing and before the start of light emission; and after elapse of time appropriate to the sample after the start of light emission.

Figure 6:
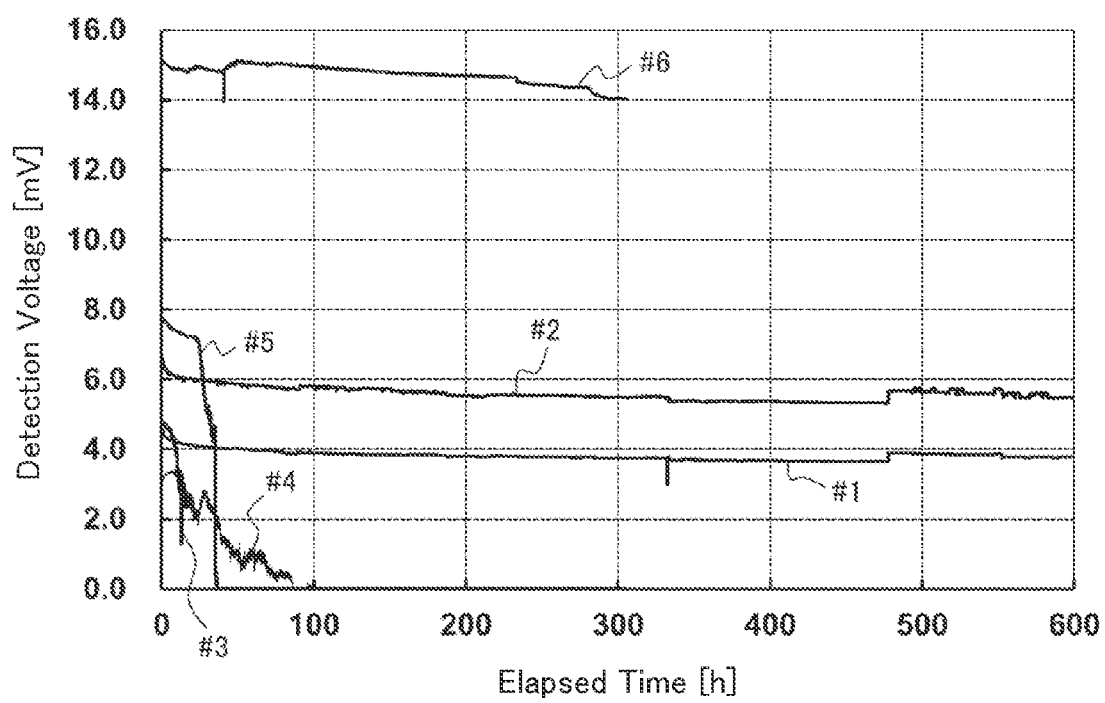
FIG. 6 is a view showing a time-dependent change in light emission output for samples #1 to #6 used in the first verification experiment.

FIG. 6 shows a time-dependent change in light emission output for the samples #1 to #8. In FIG. 6, the ordinate represents a detection voltage of the photodiode, and the abscissa represents an elapsed time. The forward current applied to each sample was 20 mA. From the measurement results shown n FIG. 8, it is apparent that in the samples #3 to #5 resin-sealed with the second type amorphous fluororesin, a defect occurs in which the light emission output rapidly decreases within 10 hours after the start of light emission. On the other hand, in the sample #1 which is not resin-sealed, the sample #2 resin-sealed with the first type amorphous fluororesin, and the sample #6 resin-sealed with the second type amorphous fluororesin but having a center emission wavelength longer than the center emission wavelengths of other samples, a rapid decrease in light emission output is not observed even after elapse of 300 hours after the start of light emission.

From the measurement results shown in FIG. 8, it is apparent that in the samples resin-sealed with the second type amorphous fluororesin, a light emission output defect occurs with some cause irrespective of a boiling temperature of the solvent when the center emission wavelength is 270 nm or less.

Next, I-V characteristics at the above-mentioned, three time points for the samples #2 to #6 are shown in FIGS. 7 to 11. The voltage in the I-V characteristic shows a forward bias in positive polarity and a reverse bias in negative polarity, and the current shows an absolute value of the current value at each time of bias.

Figure 7:
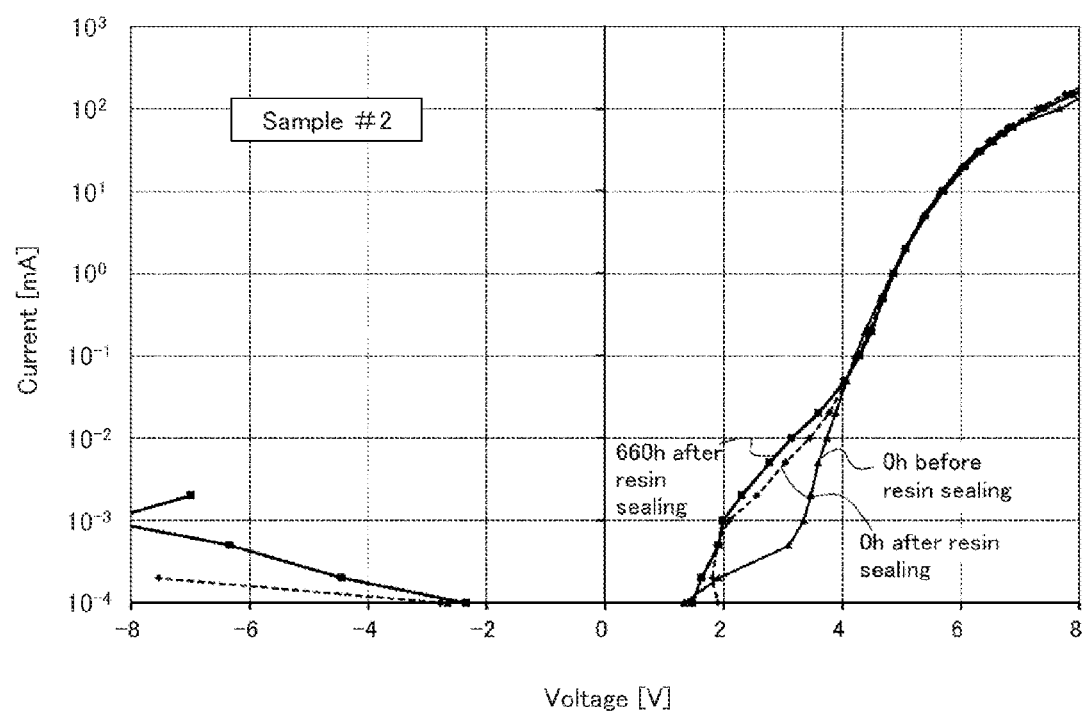
FIG. 7 is an I-V characteristic diagram for each elapsed time for the sample #2 used in the first verification experiment.
Figure 8A:
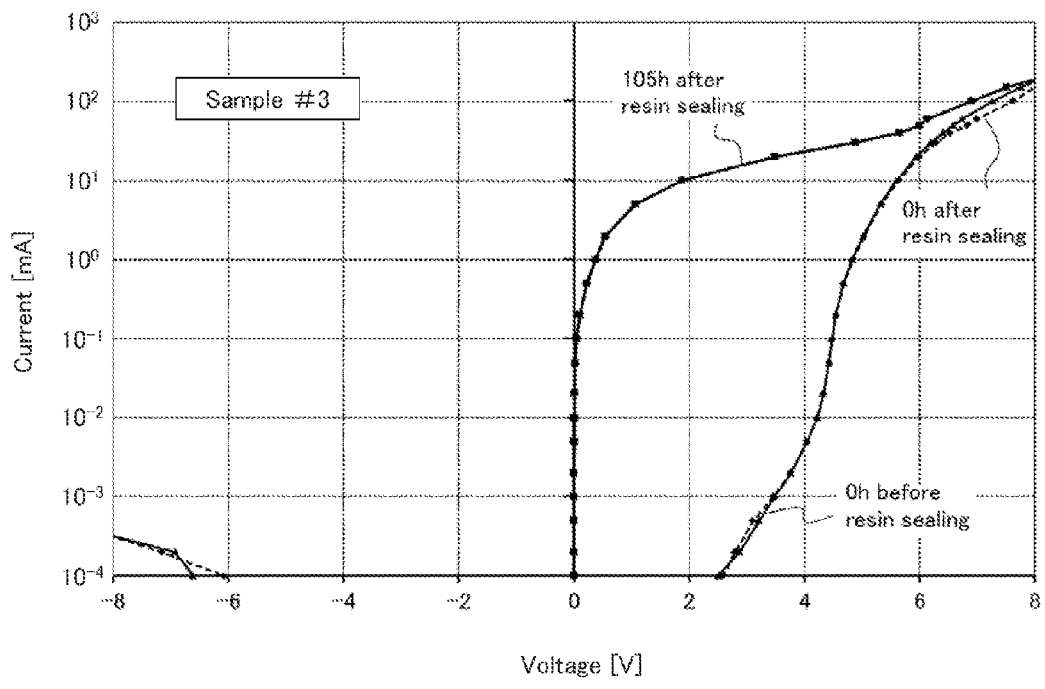
FIG. 8 is a set of I-V characteristic diagrams for each elapsed time for the sample #3 used in the first verification experiment.
Figure 8B:
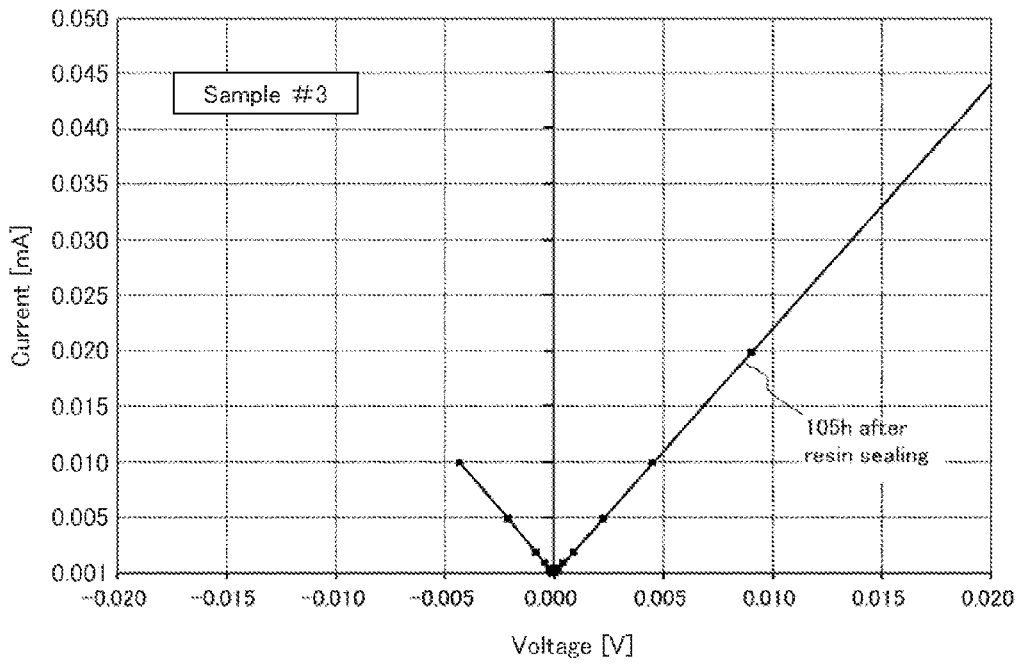
Figure 9A:
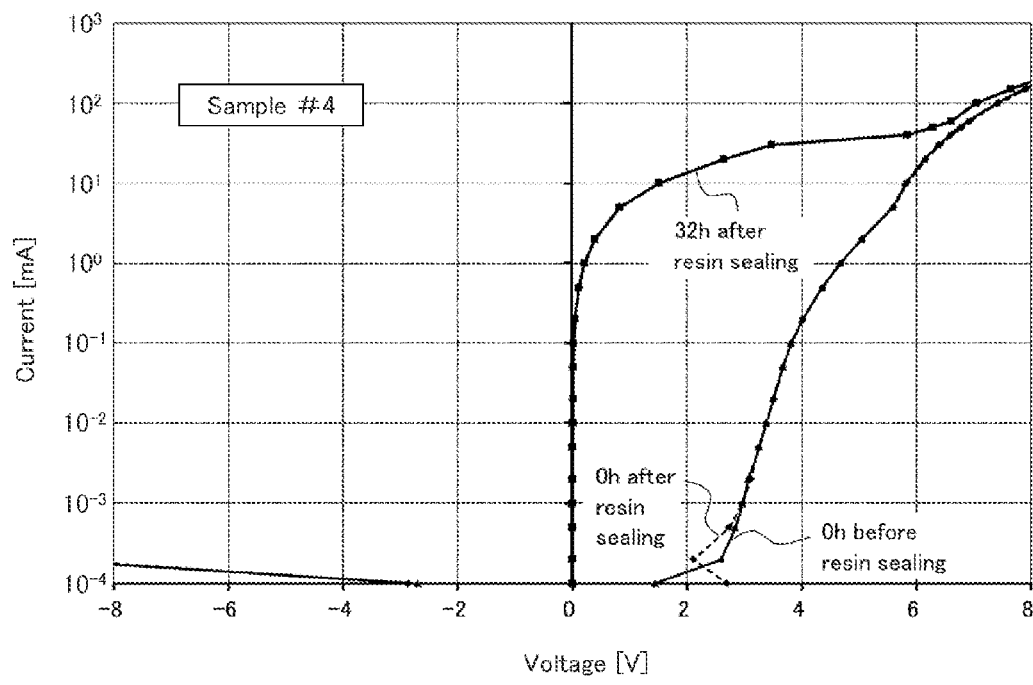
FIG. 9 is a set of I-V characteristic diagrams for each elapsed time for the sample #4 used in the first verification experiment.
Figure 9B:
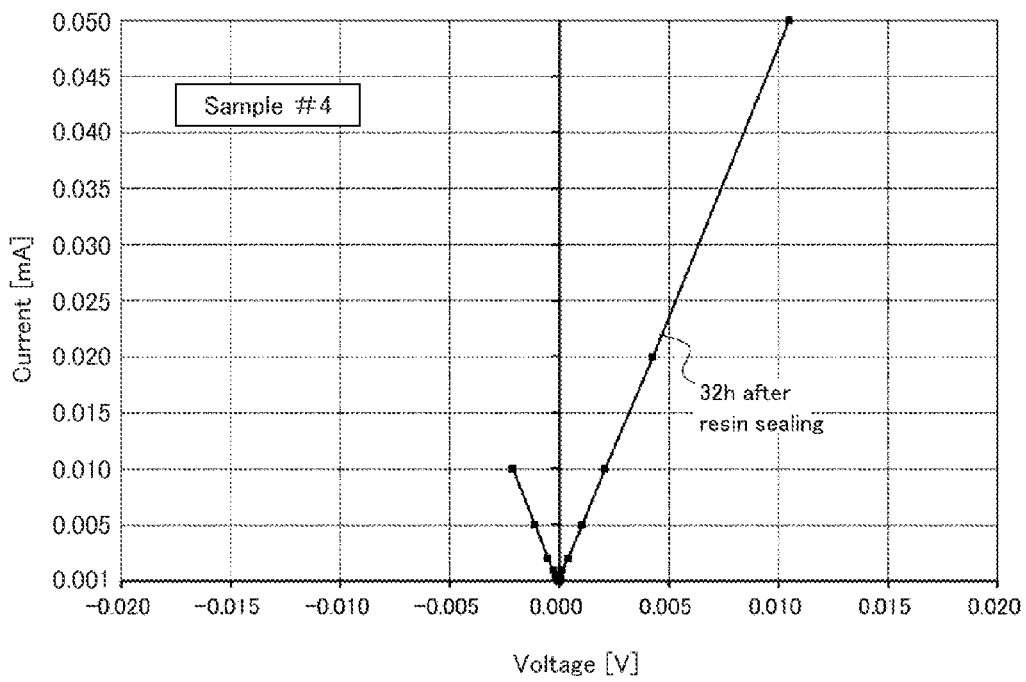
Figure 10A:
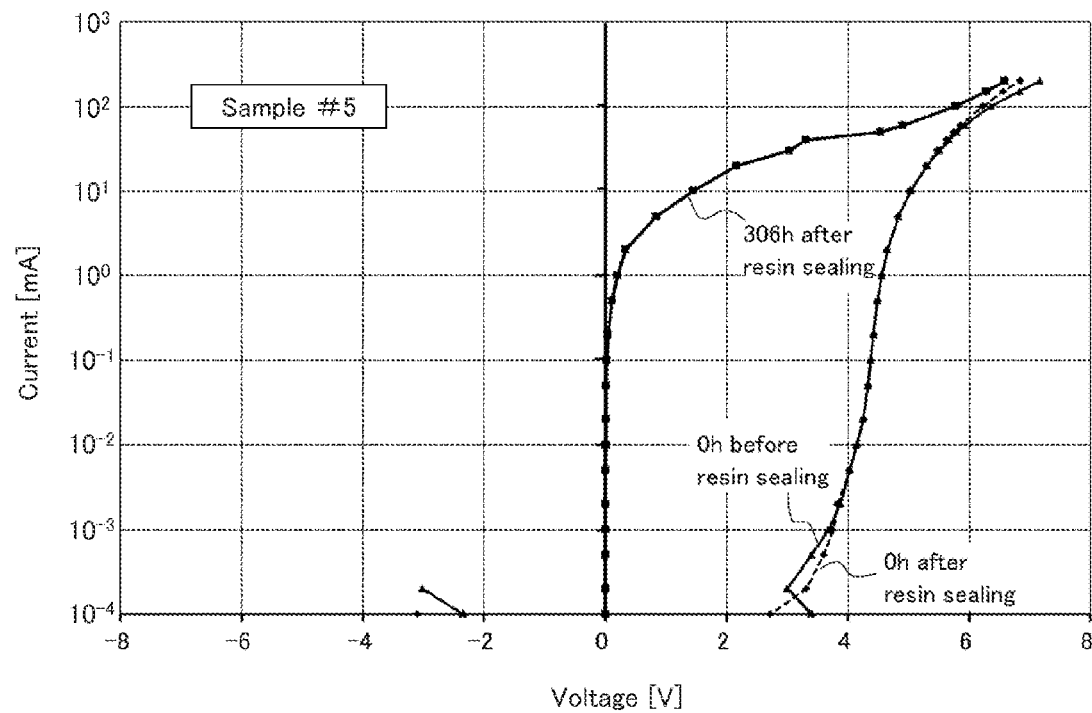
FIG. 10 is a set of I-V characteristic diagrams for each elapsed time for the sample #5 used in the first verification experiment.
Figure 10B:
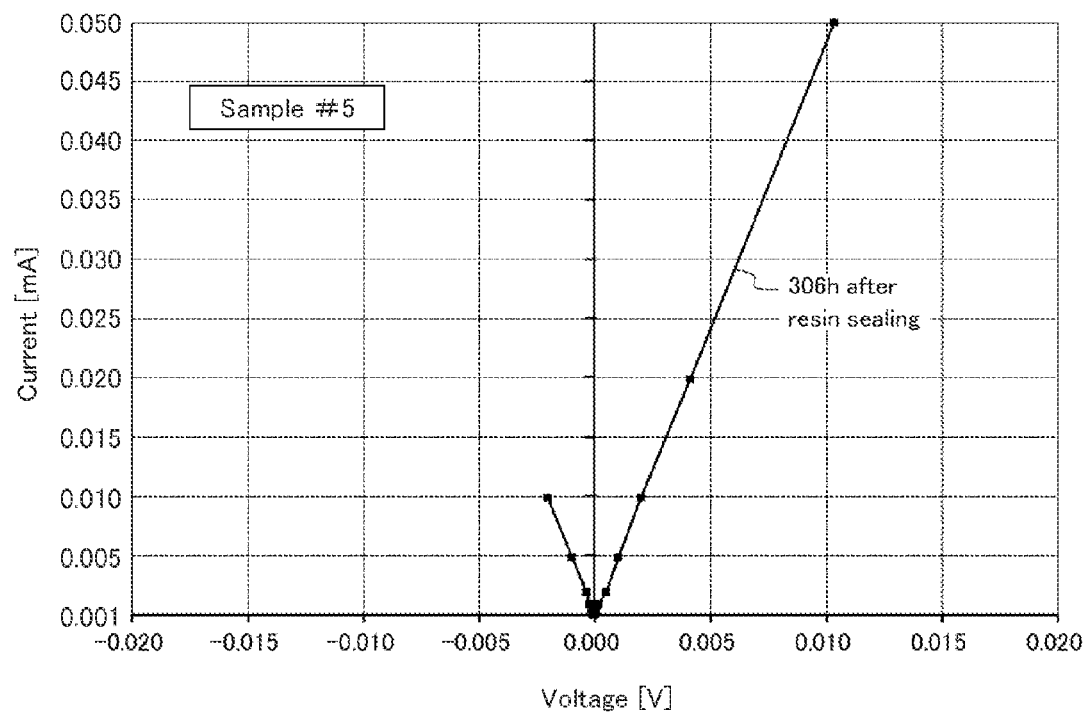
Figure 11:
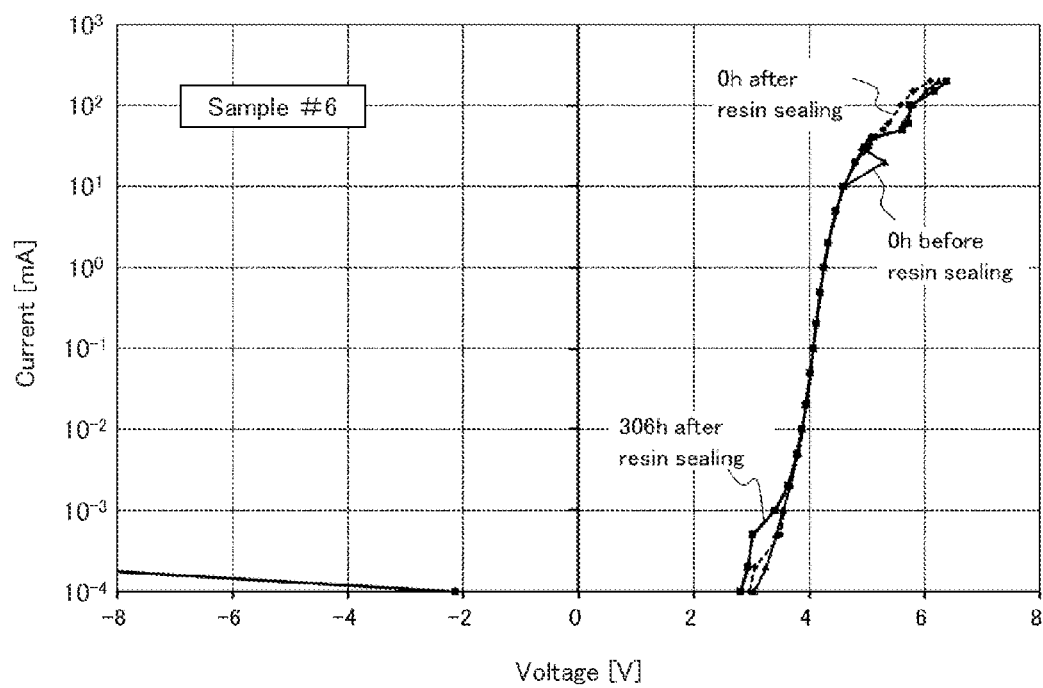
FIG. 11 is an I-V characteristic diagram for each elapsed time for the sample #6 used in the first verification experiment.

FIG. 7 shows I-V characteristics before resin sealing, after resin sealing and before the start of light emission and at the time of elapse of 660 hours after the start of light emission for the sample #2. FIG. 8(A) shows I-V characteristics before resin sealing, after resin sealing and before the start of light emission and at the time of elapse of 105 hours after the start of light emission for the sample #3, and FIG. 8(B) shows an I-V characteristic at the time of elapse of 105 hours after the start of light emission for the sample #3 with the diagram enlarged at and around an applied voltage of 0 V. FIG. 9(A) shows I-V characteristics before resin sealing, after resin sealing and before the start of light emission and at the time of elapse of 32 hours after the start of light emission for the sample #4, and FIG. 9(B) shows an I-V characteristic at the time of elapse of 32 hours after the start of light emission for the sample #4 with the diagram enlarged at and around an applied voltage of 0 V. FIG. 10(A) shows I-V characteristics before resin sealing, after resin sealing and before the start of light emission and at the time of elapse of 306 hours after the start of light emission for the sample #5, and FIG. 10(B) shows an I-V characteristic at the time of elapse of 306 hours after the start of light emission for the sample #5 with the diagram enlarged at and around an applied voltage of 0 V. FIG. 11 shows I-V characteristics before resin sealing, after resin sealing and before the start of light emission and at the time of elapse of 306 hours after the start of light emission for the sample #6. In FIGS. 7 to 11, each I-V curve before resin sealing is described as "0 h before Mold", each I-V curve after resin sealing and the start of light emission is described as "0 h after Mold", and each I-V curve after resin sealing and the start of light emission and at the time of elapse of energization time for each sample is described as "MMh after Mold" (MM is an energization time for each sample).

It is apparent that in the samples #3 to #5 in which a light emission output defect occurs as shown in FIG. 6, the I-V characteristic is considerably changed after energization for the light emission operation is continued as shown in FIGS. 8 to 10, so that a short-circuit occurs between the anode and the cathode (between the p-electrode and the n-electrode). When comprehensively considering the fact that the FV characteristic after a short-circuit has extremely high linearity as shown in FIGS. 8(B) to 10(B) in common, and the fact that for the light emission output defect, the short-circuit occurs only in samples using the second type amorphous fluororesin having a reactive terminal functional group having high bondability to a metal, and does not occur in samples using the first type amorphous fluororesin having a nonreactive terminal functional group which is not bondable to a metal, etc., it is evident that the light emission, output defect occurs due to a short-circuit between the anode and the cathode (between the p-electrode and the n-electrode), and the short-circuit is caused by the reactive terminal functional group of the second type amorphous fluororesin.

When considering the fact that in the sample #8 using the second type amorphous fluororesin and having a center emission wavelength of 290 nm, a light emission output defect similar to that in the samples #3 to #5 does not occur with an elapse time of about 300 hours, it is thought that in irradiation of ultraviolet light having a longer wavelength as compared to the samples #3 to #5, the level of the photochemical reaction is low, so that a coordinate bond is hard to be formed between a reactive terminal functional group and metal atoms.

Next, as a second verification experiment, the samples #7 and #8 were subjected to the light emission operation similarly to the samples #1 to #6, and subjected to the same light emission output measurement and I-V characteristic measurement as in the first verification experiment, and presence/absence of abnormalities between the p-electrode 28 and the n-electrode 29 of each of the samples #7 and #8 was visually inspected.

In the sample #7 using the first type amorphous fluororesin, similarly to the sample #2, a light emission output defect did not occur even after continuing the light emission operation for 283 hours, and a proper I-V characteristic was obtained. In the sample #8 prepared using the second type amorphous fluororesin, a light emission output defect occurred similarly to other samples for comparison, i.e. the samples #3 to #6, the I-V characteristic was changed after elapse of 24 hours after the start of the light emission operation, and a short-circuit condition was observed, between the anode and the cathode after elapse of 92 hours.

Figure 12:
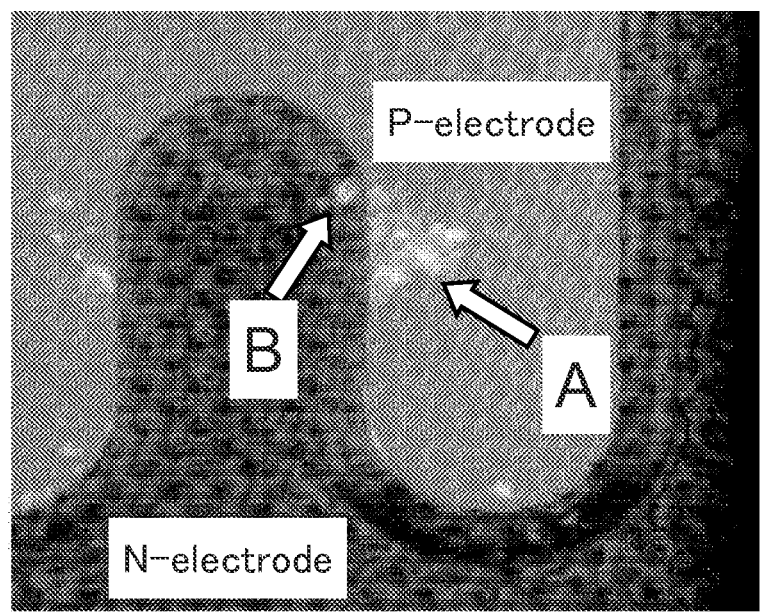
FIG. 12 is an optical microscope photograph subjected to a binarization treatment, which shows a result of observing the periphery of a p-electrode of an experimental sample #8 which is used in a second verification experiment for verifying an effect of suppressing a light emission output defect of the ultraviolet light emitting device according to the present invention and which suffers a light emission output defect.

Further, in visual inspection, as shown in the optical microscope photograph, of FIG. 12, there was a trace (arrow A) where a metal seemed to migrate on the periphery of the p-electrode 28, and a mark (arrow B) supposed to be a short-circuit spot was observed in the sample #8 in which a light emission output defect occurred. On the other hand, in the sample #7 in which a light emission output defect did not occur, a trace where a metal migrated was not found on the periphery of the p-electrode 28.

The inspection results shown in FIG. 12 are consistent with the light emission output measurement results shown, in FIG. 8 and the I-V characteristic measurement results shown in FIGS. 7 to 11, and it is apparent that the reactive terminal functional group of the second type amorphous fluororesin causes a short-circuit to occur between the p-electrode 28 and the n-electrode 29, so that a forward, voltage necessary for the light emission operation cannot be applied, between the p-electrode 28 and the n-electrode 29, and therefore a light emission output defect occurs.

It is thought that since the separation distance between the p-electrode 28 and the n-electrode 29 (between the pad electrodes 16 and 17) is shorter than the separation distance between the first and second metal electrode wirings 11 and 12, the electric field between the p-electrode 28 and the n-electrode 29 is larger than that between the first and second metal electrode wirings 11 and 12, so that the short-circuit easily occurs. However, when the separation distance between the first and second metal electrode wirings 11 and 12 is as short as the same between the pad electrodes 16 and 17 of the ultraviolet light emitting element 2, a similar short-circuit phenomenon may occur. Therefore, it is preferred that a portion in contact with the first and second metal electrode wirings 11 and 12 is also covered with the first type amorphous fluororesin having a nonreactive terminal functional group that is not bondable to a metal. In conclusion, it is preferred that at least one of the area between the pad electrodes 16 and 17 (including the bump material 5) and the area between the first and second metal electrode wirings 11 and 12, of which separation distance is shorter, is necessarily included, and covered with the first type amorphous fluororesin.

Thus, it has been confirmed from the verification experiments that in the present invention device, at least a part of the sealing resin 3 (resin film 3a) covering the metal-exposed portion is the first type amorphous fluororesin having a nonreactive terminal functional group, and therefore occurrence of a light emission output defect caused by the reactive terminal functional group is effectively suppressed.

It has been also confirmed that the effect of suppressing the light emission output defect by use of the first type amorphous fluororesin is remarkable when the center emission wavelength of the ultraviolet light emitting element 2 is shorter than 290 nm. However, even if the center emission wavelength of the ultraviolet light emitting element 2 is 290 nm or longer, the effect of suppressing the light emission output defect may be exhibited as in the case where the center emission wavelength is shorter than 290 nm when the wavelength range of the light emission wavelength is wide.

Another Embodiments

In the embodiment described above, one example of a preferred embodiment of the present invention device has been described in detail. The configuration of the present invention device is not limited to the embodiment described above, but various modifications can be made without departing from the spirit of the present invention. Hereinafter, another aspect of the present invention device will be described.

<1> In the embodiment described above, the ultraviolet light emitting element 2 is intended to be an ultraviolet light emitting diode having the structure illustrated in FIG. 3, but the ultraviolet light emitting element 2 is not limited to one having the structure shown in FIG. 3 as long as it is a nitride semiconductor light emitting element, and not only light emitting diodes but also semiconductor lasers are included.

<2> In the embodiment described above, a case is illustrated where a bare chip of one ultraviolet light emitting element 2 is placed on the sub-mount 1 having the shape illustrated in FIG. 1, thereby forming the present invention device. However, in the case where the sub-mount 1 is used, the shape, structure and material thereof are not limited to those illustrated in the embodiment described above. For example, the inner wall of the side wall portion 13 of the sub-mount 1 may be shaped into an inclined surface, and provided with a metallic surface to reflect ultraviolet light. Further, rather than placing one ultraviolet light emitting element 2 on one sub-mount 1, bare chips of a plurality of ultraviolet light emitting elements 2 may be placed directly on another board, followed by separately sealing the individual ultraviolet light emitting elements 2 with the sealing resin 3.

Further, in the embodiment described above, a case is illustrated where the pad electrodes 16 and 17 of the ultraviolet light emitting element 2 are connected, respectively, to the first and second metal electrode wirings 11 and 12 formed on the surface of the sub-mount 1, but a structure may be employed in which the first and second metal electrode wirings 11 and 12 connected to the pad electrodes 16 and 17 are metal members in contact with the pad electrodes 16 and 17, such as a lead frame, rather than thin film-shaped metal wirings formed on the sub-mount 1 or printed board, and the metal members are sealed with the sealing resin together with the ultraviolet light emitting element 2 without being in contact with an insulating member such as the sub-mount 1 or printed board.

In the embodiment described above, a case is illustrated where the ultraviolet light emitting element 2 is mounted on the sub-mount 1 by so called flip chip mounting, but for example when emitted light from the ultraviolet light emitting element 2 is extracted from the upper surface of the chip, connection of the pad electrodes 16 and 17 and the first and second metal electrode wirings 11 and 12, etc. may be performed by wire bonding with the rear surface of the bare chip of the ultraviolet light emitting element 2 being placed on the sub-mount 1, the printed board or the lead frame.

<3> In the embodiment described above, a case is illustrated where the resin film 3a covering a metal-exposed portion is formed of only the first type amorphous fluororesin, but even if the resin film 3a contains a very small amount of the second type amorphous fluororesin having a reactive terminal functional group, it is very likely that the second type amorphous fluororesin does not contribute to a short-circuit between the pad electrodes 16 and 17 or between, the first and second metal electrode wirings 11 and 12 because there is no strong electric field in the vicinity even though a reactive terminal functional group is separated from the very small amount of second, type amorphous fluororesin to form a coordinate bond between the terminal functional group and metal atoms in the case where the very small amount of second type amorphous fluororesin covers an area of the pad electrodes 16 and 17 having a short separation distance and the portion between the first and second metal electrode wirings 11 and 12 having a short facing distance, or covers metal-exposed portions having the same electric potential. Therefore, a case where the second type amorphous fluororesin is contained in an amount and at a position such that the second type amorphous fluororesin does not contribute to the short-circuit is acceptable as another embodiment of the present invention.

<4> In the embodiment described above, the first type amorphous fluororesin having a nonreactive terminal functional group that is not bondable to a metal is used for the resin film 3a covering a metal-exposed portion, and therefore adhesion between the resin film 3a and the first and second metal electrode wirings 11 and 12 is lower as compared to a case where the second type amorphous fluororesin is used. The flip chip mounting shown in FIG. 1 is preferred because the gap 18 held between the sub-mount 1 and the ultraviolet light emitting element 2 on the periphery of the bump material 5 is also filled with the first type amorphous fluororesin, and therefore the first type amorphous fluororesin filling the gap 18 serves as an anchor, so that the whole resin, film 3a is hard to be peeled off from the surface of the sub-mount 1.

However, in the case where flip chip mounting is not performed, or in the case where although flip chip mounting is performed, the contact area of the whole resin film. 3a with the sub-mount 1 is large relative to the amount of the first type amorphous fluororesin filling the gap 18, the resin filling the gap 18 may not sufficiently function as an anchor, and therefore it is preferred to separately provide a structure serving as an additional anchor, i.e. a structure in which the first type amorphous fluororesin is fixed on a base such as the sub-mount 1.

For example, in the example of the sub-mount 1 shown in FIG. 1, near the lower end portion of the inner wall, of the side wall portion 13, a recessed portion is provided, outward (in the lateral direction) from the side wall portion 13, and the recessed portion is also filled with the first type amorphous fluororesin to form the above-mentioned structure serving as an additional anchor. As the structure serving as an additional anchor, a similar anchor may be provided at a different portion of the sub-mount 1, or an anchor including a recessed portion having a narrow portion may be provided in the middle, and various structures are conceivable.

INDUSTRIAL APPLICABILITY

The ultraviolet light emitting device according to the present invention can be used as an ultraviolet light emitting device using an amorphous fluororesin as a sealing resin for sealing an ultraviolet light emitting element.

DESCRIPTION OF SYMBOLS

1 Sub-mount (base)
2 Ultraviolet light emitting element
3 Sealing resin
3a, 3b Resin film
4 Light condensing lens
5 Bump material
6 Coating solution
10 Substrate
11 First metal electrode wiring
12 Second metal electrode wiring
12a Projected portion of second metal electrode wiring

13 Side wall portion
14, 15 Lead terminal
16, 17 Pad electrode
18 Gap
20 Sapphire substrate
21 AlN layer
22 AlGaN layer
23 n-type clad layer (n-type AlGaN)
24 Active layer
25 Electron blocking layer (p-type AlGaN)
26 p-type clad layer (p-type AlGaN)
27 p-contact layer (p-type GaN)
28 p-electrode
29 n-electrode
30 Protective insulating film
A1 First region
A2 Second region

The invention claimed is:

1. An ultraviolet light emitting device comprising: an ultraviolet light emitting element formed of a nitride semiconductor; and an ultraviolet-transparent sealing resin covering the ultraviolet light emitting element, wherein
at least a specific portion of the sealing resin, which is in direct contact with a pad electrode of the ultraviolet light emitting element, is a first type amorphous fluororesin, and
a terminal functional group of a polymer or a copolymer that forms the first type amorphous fluororesin is a nonreactive terminal functional group which is not bondable to a metal that forms the pad electrode.

2. The ultraviolet light emitting device according to claim 1, comprising a base with metal electrode wiring formed on a part of a surface of a substrate, wherein the ultraviolet light emitting element is placed on the base, and
the pad electrode of the ultraviolet light emitting element is electrically connected to the metal electrode wiring.

3. The ultraviolet light emitting device according to claim 2, wherein the pad electrode and the metal electrode wiring face each other, and are electrically and physically connected to each other with a bump material interposed therebetween, and
an air gap between a side of the ultraviolet light emitting element provided with the pad electrode and an upper surface of the base is filled with the first type amorphous fluororesin.

4. The ultraviolet light emitting device according to claim 2, wherein a portion of the sealing resin, which is in contact with the metal electrode wiring, is the first type amorphous fluororesin.

5. The ultraviolet light emitting device according to claim 1, wherein the terminal functional group is a perfluoroalkyl group.

6. The ultraviolet light emitting device according to claim 5, wherein the terminal functional group is $CF_3$.

7. The ultraviolet light emitting device according to claim 1, wherein a structural unit that forms the polymer or the copolymer has a fluorine-containing aliphatic cyclic structure.

8. The ultraviolet light emitting device according to claim 1, wherein the center emission wavelength of the ultraviolet light emitting element is shorter than 290 nm.

9. The ultraviolet light emitting device according to claim 1, wherein a portion of the sealing resin, other than the specific portion, is the first type amorphous fluororesin, or a second type amorphous fluororesin having a terminal functional group different from that of the first type amorphous fluororesin.

* * * * *